United States Patent [19]

Nishizawa

[11] Patent Number: 4,613,881

[45] Date of Patent: Sep. 23, 1986

[54] VERTICAL SEMICONDUCTOR PHOTOELECTRIC TRANSDUCER WITH IMPROVED SEPARATED GATE STRUCTURE

[76] Inventor: Jun-ichi Nishizawa, 6-16, Komegafukuro 1-chome, Sendai-shi, Miyagi 980, Japan

[21] Appl. No.: 610,300

[22] PCT Filed: Sep. 2, 1983

[86] PCT No.: PCT/JP83/00295

§ 371 Date: Apr. 30, 1984

§ 102(e) Date: Apr. 30, 1984

[87] PCT Pub. No.: WO84/01056

PCT Pub. Date: Mar. 15, 1984

[30] Foreign Application Priority Data

Mar. 9, 1982 [JP] Japan .................... 57-153429

[51] Int. Cl.[4] .................................. H01L 29/80
[52] U.S. Cl. .................................. 357/22; 357/30; 357/58; 357/86; 357/20
[58] Field of Search ............ 357/22 E, 23.1, 23.14, 357/58, 51, 23.6, 23.2, 30, 20, 86

[56] References Cited

U.S. PATENT DOCUMENTS

| | | |
|---|---|---|
| 3,714,522 | 1/1973 | Komiya et al. ............. 357/23.14 |
| 4,284,997 | 8/1981 | Nishizawa ..................... 357/22 |
| 4,317,127 | 2/1982 | Nishizawa .............. 357/23.1 X |
| 4,422,087 | 12/1983 | Ronen ...................... 357/22 X |
| 4,459,556 | 7/1984 | Nanbu et al. .............. 357/22 X |
| 4,484,207 | 11/1984 | Nishizawa et al. ........ 357/22 X |

FOREIGN PATENT DOCUMENTS

| | | |
|---|---|---|
| 54-16985 | 2/1979 | Japan ........................ 357/22 E |
| 83/02037 | 6/1983 | Pct Int'l Appl. .......... 357/22 E |

Primary Examiner—Andrew J. James
Assistant Examiner—William Mintel
Attorney, Agent, or Firm—McGlew and Tuttle

[57] ABSTRACT

A semiconductor photoelectric transducer which is an improvement of a field effect transistor or static induction transistor type photoelectric transducer, is provided with a plurality of gates on both sides of a source, for controlling a main current, and in which the distances between the gate regions and the source region are made different, thereby separating the functions of both gates to provide for enhanced performance.

8 Claims, 15 Drawing Figures

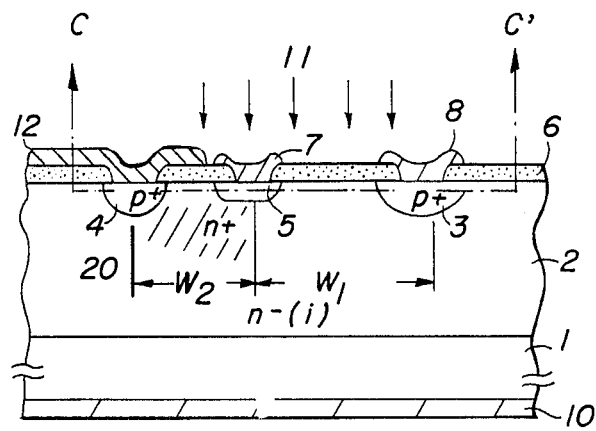
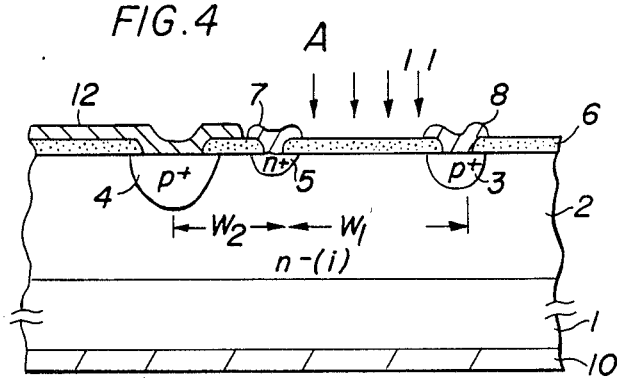
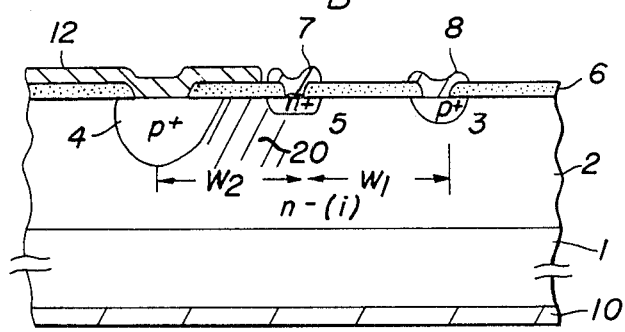

VERTICAL SEMICONDUCTOR PHOTOELECTRIC TRANSDUCER WITH IMPROVED SEPARATED GATE STRUCTURE

TECHNICAL FIELD

The present invention relates to a semiconductor photoelectric transducer.

BACKGROUND ART

Diodes are known as conventional semiconductor photoelectric transducers, such as a p-i-n photo diode and an avalanche photo diode proposed elsewhere by the present inventor, a bipolar photo transistor and so forth. High-sensitivity and high-speed photo transistors of low noise, in the form of a field effect transistor having a channel of a low impurity density or an intrinsic semiconductor and a static induction transistor (hereinafter referred to as the SIT) have already been disclosed by the present inventor in Japanese Pat. Applns. Nos. 86572/78 and 87988/78. Since they have very high-sensitivity and high-speed, their characteristics are far more excellent than those of the conventional bipolar photo transistor.

FIG. 1A shows a conventional semiconductor photoelectric transducer provided with a plurality of gates.

Reference numeral 1 indicates an $n^+$ silicon substrate, 2 an $n^-$ layer of a low resistivity or an i layer of an intrinsic semiconductor which will ultimately serve as a channel, 3 a high impurity density first gate region reverse in conductivity type from the channellayer, 4 a high impurity density second gate region reverse in conductivity type from the channel, as is the case with the region 3, 5 a high impurity density region of the same conductivity type as the substrate 1, 7 and 10 electrodes for the substrate 1 and the high impurity density regions 5, respectively, which form a main current path of the channel, 9 a gate electrode for the second gate region 4, 8 a gate electrode for the first gate region 3, and 6 an insulating film layer or multilayer insulating film as of $SiO_2$ or $Si_3N_4$ which has known insulating and surface protecting functions for isolating the electrodes 7, 8 and 9.

FIG. 1B is a top plan view of FIG. 1A. This device can be formed to have a multi-channel structure.

FIGS. 1C and D show another conventional semiconductor photoelectric transducer, in which the second gate electrode 4 is provided in the form of a cross stripe. All reference numerals are the same as those used in FIG. 1A.

With the conventional semiconductor photoelectric transducers shown in FIG. 1, it is possible to obtain a normally-ON or normally-OFF function or a function intermediate therebetween by selecting the impurity density of the high resistivity layer 2, the distance Wg between the first and second gates 3 and 4 and the diffusion depth l of the gate. In FIG. 1, when the diffusion potentials of $n^+n^-p^+$ junctions formed between the main electrode region 5 and the first and second gates 3 and 4 through the channel layer 2, respectively, are selected to be $V_{bi}$ (5-3) and $V_{bi}$ (5-4), these values become equal. The reason is that the distances between the main electrode region 5 and the first and second gate regions 3 and 4 are equal, as shown in FIG. 1 and that the impurity density of the channel 2 is symmetrical around the main electrode region 5.

Accordingly, in the semiconductor photoelectric transducers provided with a plurality of gates as shown in FIGS. 1A to 1D, since carriers generated by an optical input 11 are stored in the first and second gates with substantially the same probability, it is difficult to separate the functions of the first and second gates.

SUMMARY OF THE INVENTION

An object of the present invention is to provide a semiconductor photoelectric transducer which permits the separation of the functions of the first and second gates.

Another object of the present invention is to provide a photo transistor which is arranged so that optically excited carriers are easy to store only in one of the gates and the other gate is used merely as means for providing a fixed potential, thereby essentially reducing the gate capacitance to provide for improved frequency characteristics.

The abovesaid objective is attained by a field effect transistor or static induction transistor type photoelectric transducer of the present invention which is provided with a source region and a drain region forming high impurity density main electrode regions, a high resistivity or intrinsic semiconductor region of the same conductivity type as the main electrode regions and forming a main current path therebetween, and a plurality of gate regions reverse in conductivity type from the main electrode regions and provided on both sides of the source region in the current path, for controlling a main current, and in which the distances between the gate regions and the source region are selected to be different from each other.

BRIEF DESCRIPTION OF THE DRAWINGS

FIGS. 2A to 1C illustrate an embodiment of the present invention;

FIG. 3 illustrates another embodiment of the present invention;

FIGS. 4A and B illustrate another embodiment of the present invention, in which the second gate is specially designed;

DESCRIPTION OF THE PREFERRED EMBOIMENTS

Figure 1A:
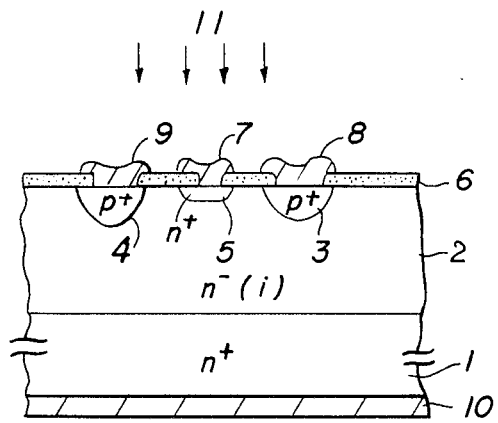
FIGS. 1A to 1D are diagrams which are explanatory of conventional semiconductor photoelectric transducers.
Figure 1B:
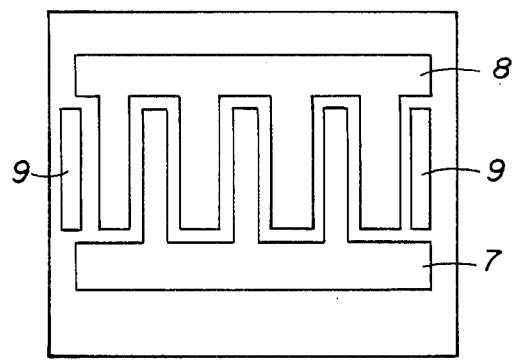
Figure 1C:
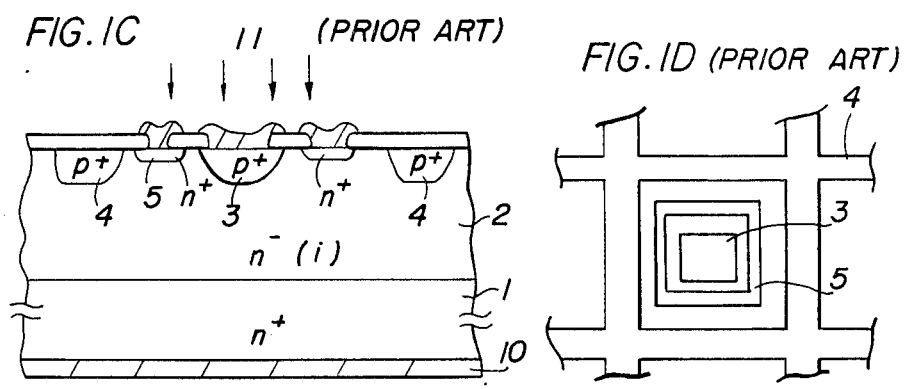
Figure 1D:
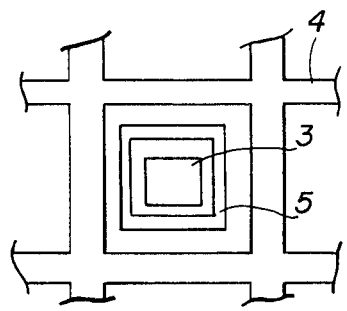
Figure 2A:
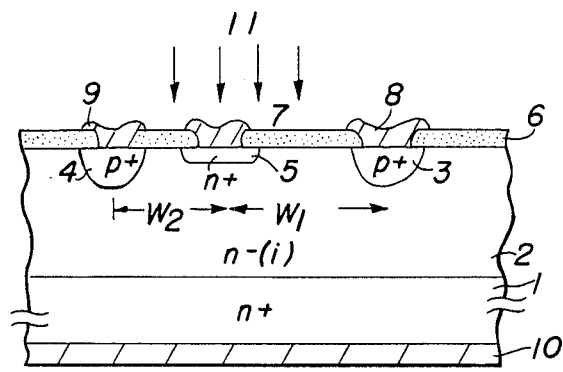

FIG. 2A is a cross-sectional view showing the basic structure of an embodiment of the semiconductor photoelectric transducer of the present invention. In the structure of FIG. 2A, respective parts correspond to those identified by the same reference numerals in FIG. 1A except that the distances $W_1$ and $W_2$ between the first and second gates 3 and 4, both having an impurity density exceeding $10^{17}$ cm$^{-3}$, and the source 5 are not equal. By selecting $W_1 > W_2$, the light receiving area of a $p^+ - n^-(i) - n^+$ diode between the source 5 and the gate 3 can be made larger than the light receiving area of a $p^+ - n^-(i) - n^+$ diode between the second gate 4 and the source 5. When $W_1 > W_2$, the amount of change in the diffusion potential $V_{bi}$ of the $p^+ - n^-(i) - n^+$ diode by the signal of the optical input 11 is such that the diffusion potential $V_{bi}$ (5-3) between the first gate 3 and the source 5 varies less than does the diffusion potential $V_{bi}$ (5-4) between the second gate 4 and the source 5.

The photoelectric conversion by the optical input 11 is facilitated by the voltage variations of the $p^+-n^-(i)-n^+$ diode between the first gate 3 and the source region 5.

Since the distance $W_1$ between the first gate 3 and the source 5 is larger than the distance $W_2$ between the second gate 4 and the source 5, current from the source 5 to the drain 1 is likely to flow in the channel region on the side of the first gate 3.

Figure 2B:
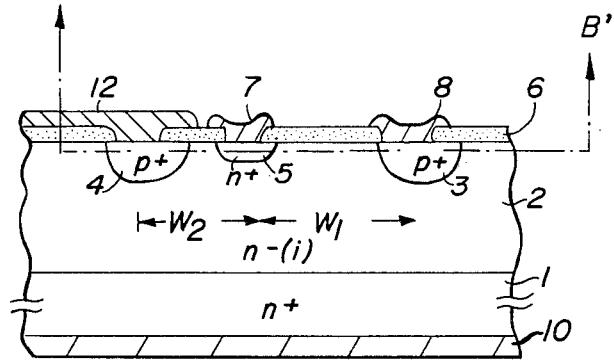

An embodiment shown in FIG. 2B is provided with a film 12 for shielding the region between the second gate 4 and the source 5 from the optical input 11. The light shielding film 12 need only to be a metal such as, for example, aluminum or gold, resin or a film which is able to filter light of a wavelength to be applied.

Figure 2C:
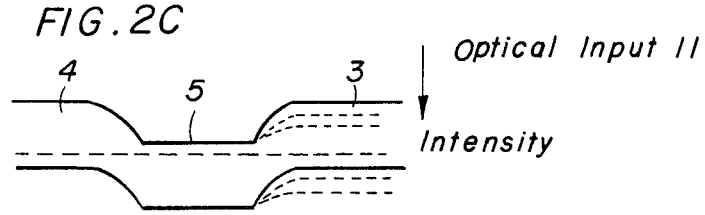

FIG. 2C shows a potential diagram, by the optical input 11, along the one-dot chain line B-B' in FIG. 2B.

The optical input 11 reduces mainly the diffusion potential between the first gate 3 and the source 5, and current by the optical input 11 flows mainly between the first gate 3 and the source 5. It is difficult for current to occur between the second gate 4 and the source 5, so that the first gate 3 and the second gate 4 are more effective in providing photoelectric conversion efficiency and good frequency characteristic than in the conventional semiconductor photoelectric transducers.

FIG. 3 is a cross-sectional view illustrating another embodiment in which the impurity density of the channel is raised near the second gate 4 and the source 5 for making the diffusion potential $V_{bi}$ (5-4) between the second gate 4 and the source 5 higher than the diffusion potential $V_{bi}$ (5-3) between the first gate 3 and the source 5. A region 20 can be formed by driving phosphorus into the channel region through the ion implantation technique.

The diffusion potential $V_{bi}$ (5-3) between the first gate 3 and the source 5 becomes smaller, along the one-dot chain line in the cross-sectional view, than the diffusion potential $V_{bi}$ (5-4) between the second gate 4 and the source 5.

FIG. 4A illustrates, in cross-section, another embodiment in which the impurity density and size of the second gate 4 is increased one or more orders of magnitude over the impurity density of the first gate 3 to thereby raise the diffusion potential $V_{bi}$ (5-4) between the second gate 4 and the source 5 higher than the diffusion potential $V_{bi}$ (5-3) between the first gate 3 and the source 5. This can be accomplished by effecting $p^+$ diffusion for the first and second gates 3 and 4 separately of each other, or by selectively implanting ions for different dosages of the first and second gates 3 and 4. FIG. 4B is a cross-sectional view of another embodiment in which the region 20 of a higher impurity density than that of the channel is provided between the second gate 4 and the source 5 in the embodiment of FIG. 4A.

Figure 5A:
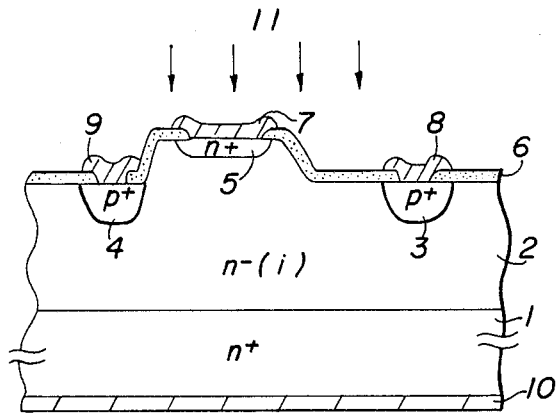
FIGS. 5A to 5D illustrate other embodiments of the present invention, in which gates are formed deeper than the source.
Figure 5B:
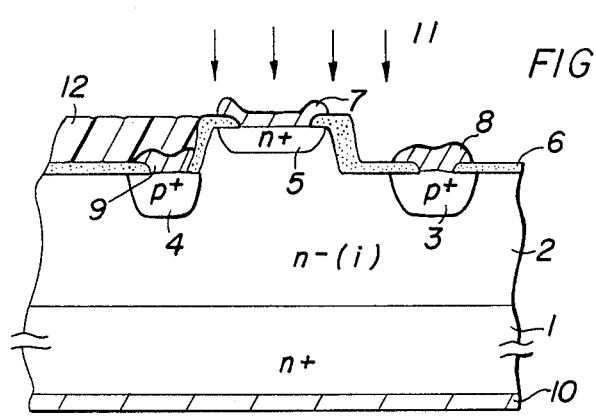
Figure 5C:
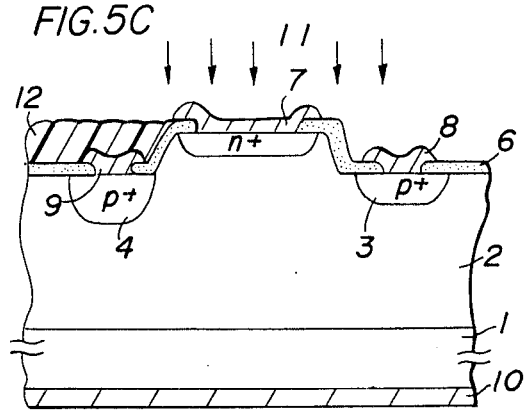
Figure 5D:
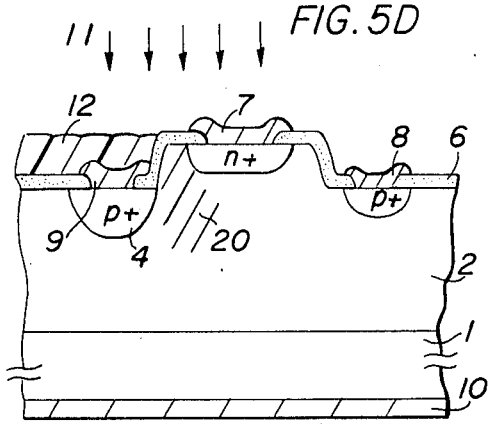

FIGS. 5A to D illustrate other embodiments in which the gate regions 3 and 4 are formed below the plane of the source region 5, decreasing the stray capacitance between each gate and the source. For forming the gate regions at such lowered positions, use can be made of such methods as chemical etching, plasma etching and processing utilizing oxide and nitride films. FIG. 5A shows an embodiment in which the distance between the first gate and the source is larger than the distance between the second gate and the source, 5B shows an embodiment which is characterized in that the light shielding film 12 is provided in the vicinity of the second gate in the same structure as that shown in FIG. 4A, FIG. 5C shows an embodiment which is characterized in that the impurity density of the second gate region 4 is higher than the impurity density of the first gate region 3, and FIG. 5D shows an embodiment which is characterized in that the impurity density of the region between the second gate and the source is further increased higher than the impurity density of the channel region in the embodiment of FIG. 5C.

According to experimental results obtained with trial products of devices in which the gate is split into two and the distance $W_1$ between the first gate and the source is larger than the distance $W_2$ between the second gate and the source as in the embodiments shown in FIGS. 2 to 5, it has been proved that as the difference between the distances $W_1$ and $W_2$ increases, for example, from $W_1-W_2=1\mu$ to $W_1-W_2=2.0\mu$, the output sensitivity to light intensity increases as compared to the case where $W_1=W_2$.

Figure 6:
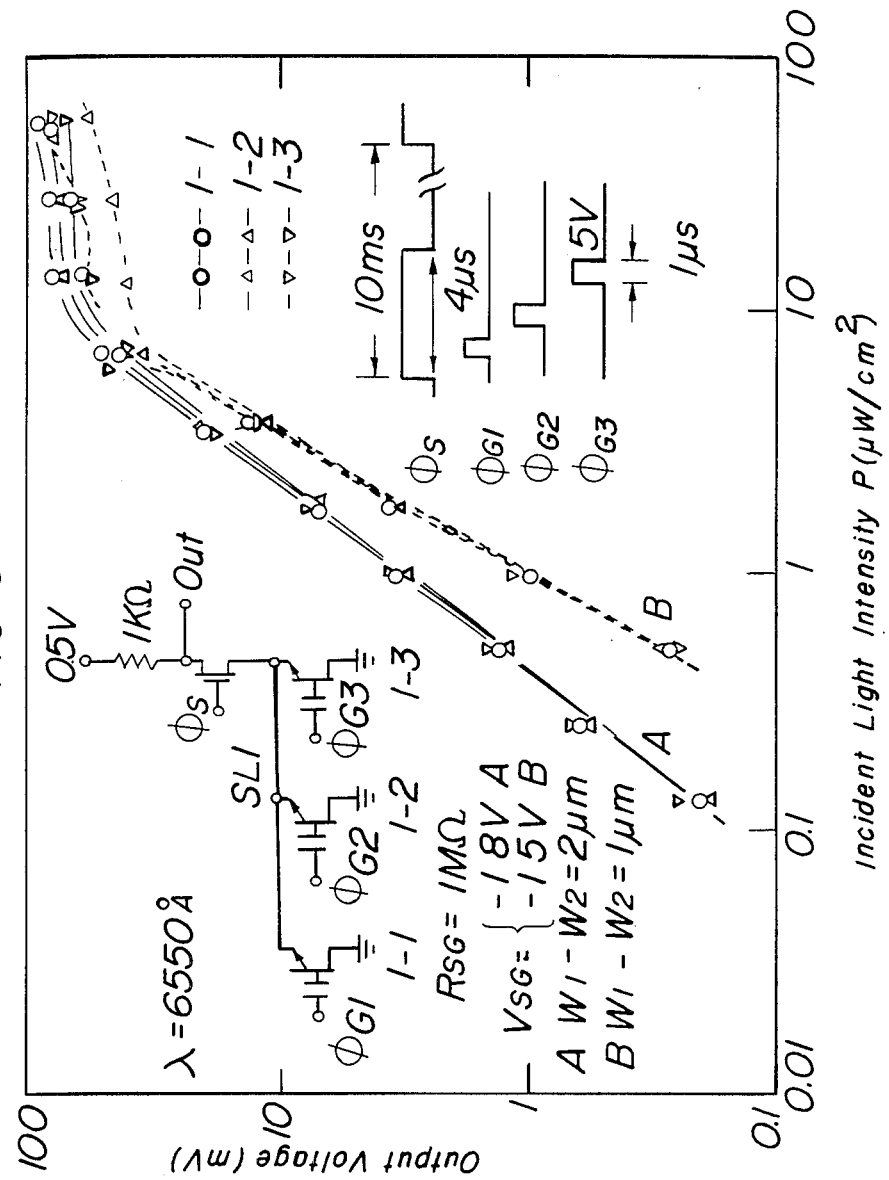
FIG. 6 is a graph showing the relationship between the incident light intensity and the output voltage, based on an embodiment of the present invention.

FIG. 6 shows the relationship between the incident light intensity and the output voltage for three bit cells of 16 bits of a device provided with a 4×4 cell matrix structure of the FIG. 2B embodiment which is easier to fabricate than any other embodiments of the present invention. The line A corresponds to the case where $W_1-W_2=2.0\mu$ and the line B the case where $W_1-W_2=1.0\mu$. Apparently the line A shows the output sensitivity to lower light intensity. On the first gate of each device cell, an internal capacitor is provided which is made up of an $SnO_2/SiN/p^+$ gate Si. In this trial product of the device, the second $p^+$ gate is formed in cross stripes, by simultaneous diffusion, and is made equipotential throughout. The device is fabricated by one high resistivity $n^-$ epitaxial growth step and two diffusion steps of a $p^+$ gate diffusion (for the first and second gates) and an $n^+$ source diffusion. In this experiment, the second gate is supplied with $V_{SG}=-1.8$ V(A) and a bias of $-1.5$ V(B) via a resistor of $R_{SG}=1$ MΩ, and a pulse $\phi_G$ having a height of 5 V and a width of 1μsec is applied only to the first gate via the capacitor formed by the $SnO_2/SiN/p^+$ gate Si, for each light irradiation time of 10 msec, by which an integrated value of optical information of a wavelength of 6550 Å is read out. The impurity density of the $n^-$ high resistance epitaxial layer is $\sim 10^{13}$ cm$^{-3}$ or so, and the diffusion depth of the gate is 6 to 8μ. In the device described in connection with FIG. 6, the size of one cell is $100\mu \times 100\mu$, but cells of sizes up to $300\mu \times 300\mu$ can easily be manufactured.

Since the embodiments of the present invention shown in FIGS. 2 to 6 are easy to fabricate and are formed in substantially vertical configurations, the devices can be made small in size. By splitting the gate in two and making the sensitivity dependent upon a specified part of the split gate alone, the sensitivity to weak light is improved as compared with the sensitivity of the conventional transducers.

Various modifications of the device structure can be effected within the scope of the present invention described above, and as referred to above with regard to FIG. 6, a capacitor may also be provided on the first gate, and it is also possible to provide a high-speed photo sensor having connected thereto a MOS transistor or field effect transistor. Also, it is possible to employ a system of making the second gate floating, a system of applying a fixed bias to the second gate, a system of applying a bias to the second gate by connecting thereto a resistor of a high resistance, or a system of connecting a capacitor of a large value to the second gate.

The present invention offers a novel photo-sensor in the field of the static induction transistor or FET photosensor.

I claim:

1. A vertical semiconductor photoelectric transducer with improved separated gate structure, comprising a semiconductor substrate of one conductivity type, a semiconductor high resistivity layer formed on the substrate, a main source region and a main drain region formed by second conductivity type impurity diffusion regions, a high resistivity semiconductor channel region of the same conductivity type as the main source and drain regions for forming a main current path between the main source and drain semiconductor regions, and first and second gate regions reverse in conductivity type from the main source and drain semiconductor regions and provided in the vicinity of and on sides of the source region for controlling a main current between the source and drain, characterized in that the distances between the first and second gate regions and the source region are different from each other, the channel region defined between the first and second gates is completely depleted by both the potentials of the first and second gates, and the distance between the first gate region and the source region is made longer than that between the second gate region and the source region to increase the optical sensitivity of the first gate region relative to the optical sensitivity of the second gate region.

2. A vertical semiconductor photoelectric transducer with improved separated gate structure according to claim 1, wherein each semiconductor region is made of Si semiconductor material and is characterized as having an MIS capacitor formed on the first semiconductor gate region and the MIS capacitor is made of $SnO_2$ as a transparent metal electrode, a silicone nitride thin layer and the first semiconductor gate region.

3. A vertical semiconductor photoelectric transducer with improved separated gate structure according to claim 1, including an insulation layer over said channel region, said source region and said first and second gate regions, said insulation layer having apertures for exposing at least a portion of said source region and said first and second gate regions, a source electrode connected to an exposed portion of said source region, a gate electrode connected to an exposed portion of said first gate region and an optical filter to prevent optical penetration is connected to an exposed portion of said second gate region and extending over said entire second gate region.

4. A vertical semiconductor photoelectric transducer with improved separated gate structure according to claim 3, wherein said channel region has higher impurity density between said source region and said second gate region than elsewhere in said channel region.

5. A vertical semiconductor photoelectric transducer with improved separated gate structure according to claim 4, wherein said second gate region has a higher impurity density than said first gate region.

6. A vertical semiconductor photoelectric transducer with improved separated gate structure according to claim 5, wherein said first and second gate regions are disposed on a recessed surface formed in a main semiconductor surface of the source region.

7. A vertical semiconductor photoelectric transducer with improved separated gate structure according to claim 1, wherein said channel region has partly higher impurity density between said source region and said second gate region than elsewhere in said channel region.

8. A vertical semiconductor photoelectric transducer with improved separated gate structure according to claim 1, wherein said second gate region has a higher impurity density than said first gate region.

* * * * *